United States Patent [19]

Mann et al.

[11] Patent Number: 5,801,592
[45] Date of Patent: Sep. 1, 1998

[54] AMPLITUDE STABILIZED OSCILLATOR CIRCUIT

[75] Inventors: Wolfgang Mann, Isernhagen; Horst Schaefer, Barsinghausen, both of Germany

[73] Assignee: Sennheiser electronic GmbH & Co. KG, Wedemark, Germany

[21] Appl. No.: 858,611

[22] Filed: May 21, 1997

[30] Foreign Application Priority Data

May 23, 1996 [DE] Germany .................. 196 20 760.6

[51] Int. Cl.⁶ ............... H03B 5/12; H03C 3/22; H03L 5/00
[52] U.S. Cl. ............ 331/109; 331/117 R; 331/183; 331/177 V; 332/136; 381/3
[58] Field of Search ................. 331/109, 117 R, 331/117 FE, 168, 183, 177 V; 332/135, 136; 381/3

[56] References Cited

U.S. PATENT DOCUMENTS

| | | | |
|---|---|---|---|
| 3,321,715 | 5/1967 | Bloch | 331/109 |
| 3,982,210 | 9/1976 | Gehrke | 331/109 |

FOREIGN PATENT DOCUMENTS

| | | |
|---|---|---|
| 1 366 538 | 9/1974 | United Kingdom. |
| 1 453 132 | 10/1976 | United Kingdom. |
| 1 541 040 | 2/1979 | United Kingdom. |

*Primary Examiner*—Siegfried H. Grimm
*Attorney, Agent, or Firm*—McAulay Fisher Nissen Goldberg & Kiel, LLP

[57] ABSTRACT

An oscillator circuit is provided for stabilizing the amplitude of a HF oscillation of an audio signal. In such an oscillator circuit, an audio signal having a frequency in the range of 20 Hz . . . 20 kHz is coupled into the oscillator circuit, is modulated with a high frequency and is emitted in the form of an RF audio signal having a frequency of more than 2 MHz. Such an oscillator circuit is used for instance in an infrared transmitting unit, wherein a low frequency audio signal is transformed into a higher frequency infrared signal. The higher frequency audio signals are transmitted via infrared channel to an appropriate receiving unit—for instance to infrared head phones—which comprises a receiving unit having an appropriate demodulator and preferably also a stereo-decoder in order to reproduce the low frequency audio signals. The oscillator for stabilizing the amplitude of a high frequency oscillation comprises a resonant circuit which is coupled with a first transistor having a base terminal, an emitter contact, and a collector contact. The first transistor develops an output voltage at the emitter contact which is fed back into a base circuit of the first transistor. The collector contact of the first transistor is coupled to a supply voltage source. The supply voltage source is coupled to the base terminal of the first transistor via a resistor. The emitter contact of the first transistor is coupled with the base terminal of a second transistor. The second transistor has a collector contact which is connected to the base terminal of the first transistor for controlling the voltage at the base terminal of the first transistor.

5 Claims, 2 Drawing Sheets

VCC = 7V    RF-Out : F = 2.3 MHz

| | | |
|---|---|---|
| R1 = 100k | C1 = 22nF | D1 = BB 620 |
| R2 = 47k | C2 = 18pF | |
| R3 = 820R | C3 = 100nF | T1 = BFS 19 |
| R4 = 1.5k | C4 = 1nF | T2 = BFS 19 |
| R5 = 1k | | |
| R6 = 4.7k | L1 = 120uH | |

VCC = 7V    RF-Out : F = 2.3 MHz

R1 = 100k      C1 = 22nF      D1 = BB 620
R2 = 47k       C2 = 18pF
R3 = 820R      C3 = 100nF     T1 = BFS 19
R4 = 1.5k      C4 = 1nF       T2 = BFS 19
R5 = 1k
R6 = 4.7k      L1 = 120uH

AMPLITUDE STABILIZED OSCILLATOR CIRCUIT

BACKGROUND OF THE INVENTION a) Field of the Invention

The invention relates to an oscillator circuit for stabilizing the amplitude of an HF oscillation of an audio signal. In such an oscillator circuit, an audio signal having a frequency in the range of 20 Hz ... 20 kHz is coupled into the oscillator circuit, is modulated with a high frequency, and is emitted in the form of an RF audio signal having a frequency of more than 2 MHz. Such an oscillator circuit is, for instance, used in an infrared transmitting unit, wherein a low frequency audio signal is transformed into a higher frequency infrared signal. The higher frequency audio signals are transmitted via infrared channel to an appropriate receiving unit—for instance to infrared head phones—which comprises a receiving unit having an appropriate demodulator and preferably also a stereo-decoder in order to reproduce the low frequency audio signals.

b) Description of the Related Art

In the self-oscillating oscillator circuits known in the prior art, one problem consists in the fact that, when the oscillator circuit is manufactured, compensation for the definition and stabilization of the amplitude of the RF audio signals has to be carried out. In order to achieve such compensation, a measurement has to be carried out first and, thereafter, the amplitude stabilized to a desired value either automatically or manually, using an appropriate adjusting device such as a trimming potentiometer.

An amplitude stabilization is necessary because in an oscillator circuit comprising a transistor in a common collector circuit, the amplitude of the HF oscillation almost exclusively depends on the short-circuit forward current transfer ratio of the transistor, and because minimum component tolerances already cause a change of the short-circuit forward current transfer ratio. If the compensation is not carried out, which is often the case in very cheap devices, there results a lower quality of the signal transmission and reproduction. If the compensation is carried out, the costs of the oscillator circuit and hence also of the device which comprises the oscillator circuit, increase due to the incurred expenses.

OBJECT AND SUMMARY OF THE INVENTION

It is therefore the primary object of the invention to overcome the above-mentioned problems and disadvantages without accepting decreases in quality in the signal transmission and reproduction.

According to the invention, this object is achieved by providing an oscillator circuit for stabilizing the amplitude of a high frequency oscillation comprises a resonant circuit which is coupled with a first transistor having a base terminal, an emitter contact, and a collector contact. The first transistor develops an output voltage at the emitter contact which is fed back into a base circuit of the first transistor. The collector contact of the first transistor is coupled to a supply voltage source. The supply voltage source is coupled to the base terminal of the first transistor via a resistor. The emitter contact of the first transistor is coupled with the base terminal of a second transistor. The second transistor has a collector contact which is connected to the base terminal of the first transistor for controlling the voltage at the base terminal of the first transistor.

The invention is based on the finding that by controlling a second transistor via the emitter output voltage of the first transistor, one can adjust downwardly the base voltage of the first transistor to such an extent that a stable general condition is created, and that the amplitude of the emitter output voltage of the RF audio oscillation is adjusted to the desired value. While the invention requires a second transistor, other components such as a trimming potentiometer, which were required in the past, are no longer necessary. Furthermore, both transistors can have the same construction, so that no special components are required in order to do completely without any automatic or manual compensation when producing the oscillator circuit. Furthermore, when coupling the second transistor into the emitter-base circuit of the first transistor, a favorable harmonic spectrum of the RF initial oscillation is obtained, so that a harmonic filtering which has been necessary in the past in order to obtain a desired quality, can also be avoided. Up to the present, such a harmonic filtering has been obtained via appropriate filters.

BRIEF DESCRIPTION OF THE DRAWINGS

The invention will now be described in more detail, by way of an example embodiment, with reference to the accompanying drawings, in which.

DESCRIPTION OF THE PREFERRED EMBODIMENTS

Figure 1:
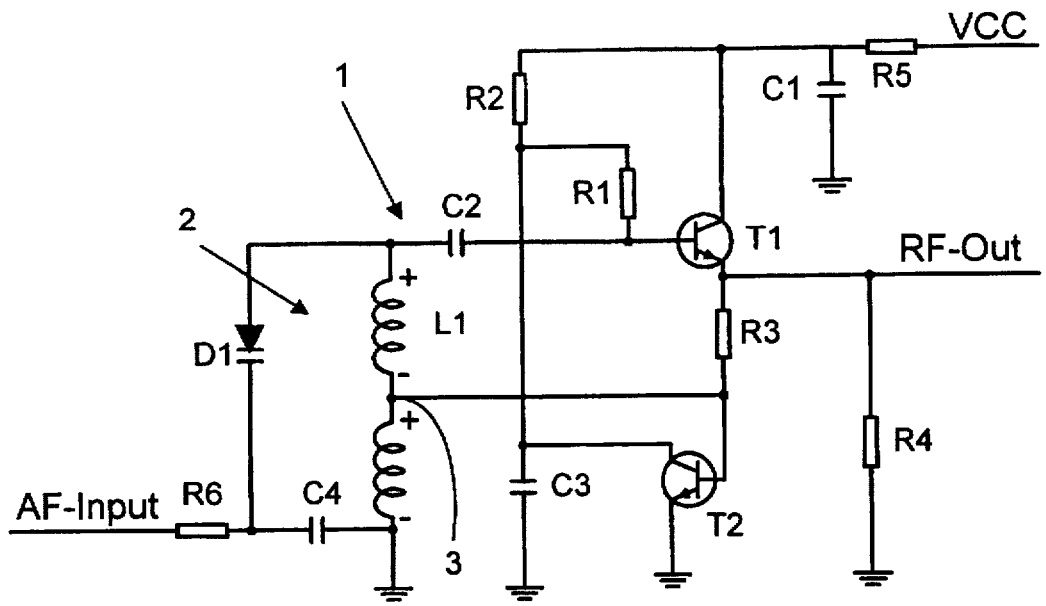
FIG. 1 is a wiring diagram of an oscillator according to the invention.

FIG. 1 shows an oscillator circuit 1 comprising a resonant circuit 2 which consists of an oscillator coil L1 and a capacitance diode D1. A low frequency, i.e., a frequency in the range of 20 Hz to 20 kHz, audio-frequency AF is coupled into the resonant circuit 2 via a resistor R6. The oscillator coil comprises a coupling contact 3 which is connected both to the base terminal of a second transistor T2 and via a resistor R3 to the emitter output terminal of the first transistor T1. Furthermore, resonant circuit 2 is connected via a capacitor C2 to the base terminal of the first transistor T1. A high frequency RF (radio frequency) audio signal is transmitted via the emitter output terminal of the first transistor T1, and the emitter output terminal of the first transistor T1 is also connected to ground via a resistor R4. The base terminal of the first transistor T1 is firstly connected to the collector contact of a second transistor T2 via a resistor R1, secondly connected to ground via a capacitor C3, and thirdly connected to the collector contact of the first transistor T1 via a resistor R2. The collector contact of the first transistor is connected to ground via a capacitor C1, and is at the same time connected to a voltage supply source VCC via a resistor R5.

The component values given in the drawings should be seen merely as an example, and the invention is not restricted to the actual components shown in the drawings.

The oscillator circuit shown is an oscillator wherein the transistor is a common collector circuit. The feedback of the output voltage RF-OUT is done from the emitter circuit into the base circuit. The voltage division is obtained via transformation by coupling the emitter output voltage into the oscillator circuit. The resistors R1 and R2 have the function to generate the base bias from the supply voltage.

Not talking into account the second transistor T2, such a circuit has the disadvantage in that the amplitude of the HF oscillation RF-OUT depends on the short-circuit forward current transfer ratio of the oscillator transistor T1. In the case of a series device, this generally results in an additional amplitude compensation, either automatically or manually. It is unnecessary to carry out such a compensation when the additional transistor T2 is included.

During the transient effect of the oscillator, the first transistor T1 receives via R1 and R2 a maximum base current, which causes a high collector current and thereby a high rate of rise of the first transistor T1. This causes the oscillator to easily start oscillating. When the output voltage at the emitter contact reaches the base-emitter threshold voltage of the second transistor T2, the second transistor T2 adjusts the voltage at the base terminal of the first transistor T1 downward to such an extent that a stable condition is obtained. Thus the amplitude of the HF oscillation RF-OUT is stabilized by back-coupling the output voltage at the emitter contact of the first transistor via the base-emitter circuit of the second transistor.

The above described circuit furthermore results in an advantageous harmonic spectrum of the HF oscillation, with the result that a harmonic filtering, which has been common practice so far, is not necessary any more. The resistors R3 and R4 are tuned so that they have a minimum nonlinear distortion factor.

In stereo sets, the left and the right audio channels respectively need separate oscillator circuits, so that the two compensation processes which have been required up to now in stereo sets are not necessary any more, when the oscillator circuit according to the invention is used. The cost savings related therewith are significant and very advantageous.

The above described oscillator circuit easily provides the same audio transmitting and reproduction quality as obtained in aligned oscillator circuits. In addition, the described oscillator circuit is more independent of temperature than previous oscillator circuits. In order to adjust the amplitude to a desired value, a diode can be provided at the base terminal of the transistor T2, so that this allows the amplitude of the output signal RF-OUT to have the desired value in order to be processed easily by subsequent circuits.

Figure 2:
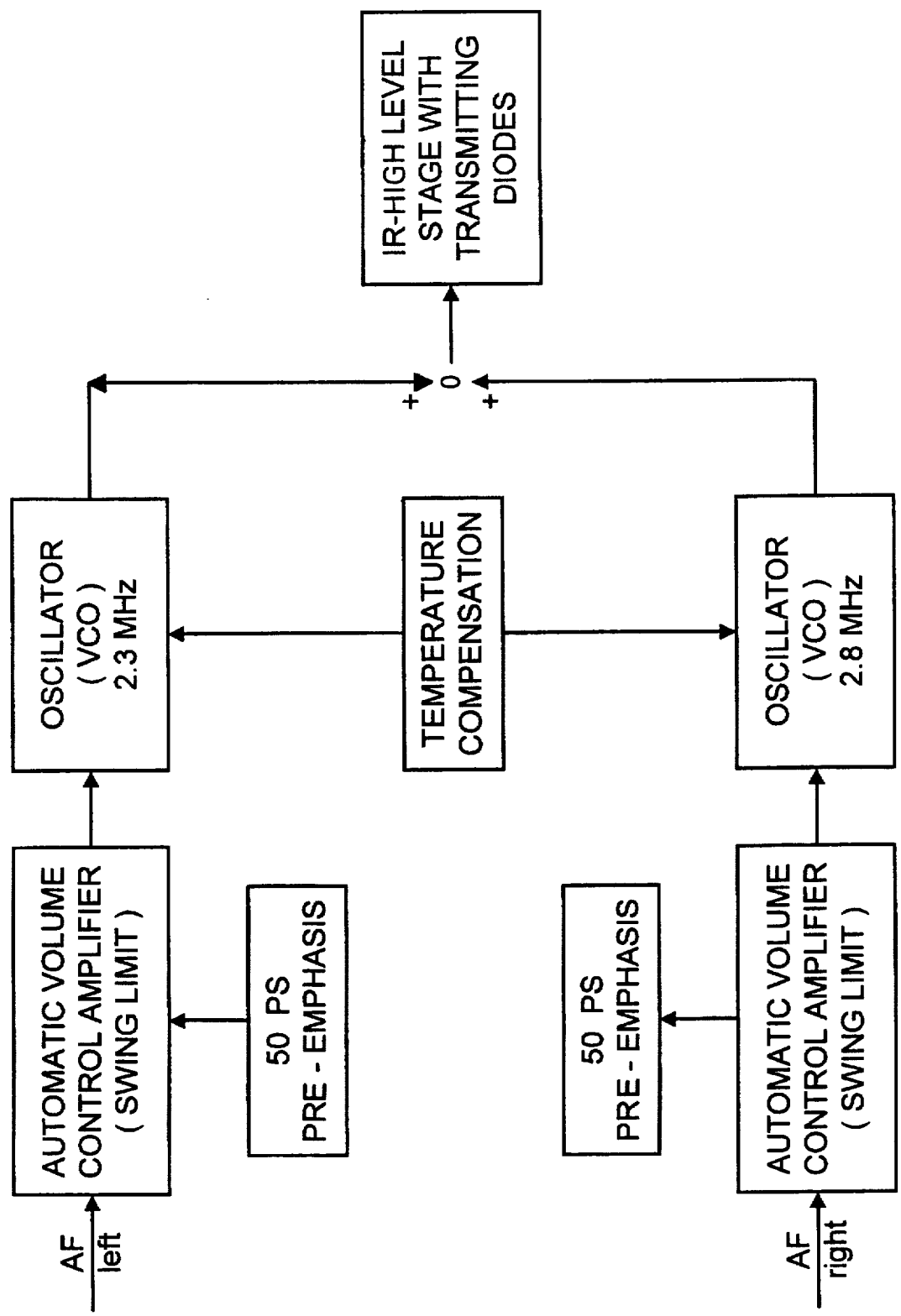
FIG. 2 is a block diagram of an IR transmitting unit according to FIG. 1.

FIG. 2 shows a block diagram of an infrared transmitting unit comprising two oscillator circuits according to FIG. 1, which differ in that the output frequency of the left audio signal is at about 2.3 MHz, and that the output frequency of the right audio signal is at 2.8 MHz. Before the left and the right audio signals are fed into the oscillator circuits shown in FIG. 1, they are fed into an appropriate automatic volume control amplifier having an appropriate swing limit, so that a swing limited signal is fed into the oscillator circuits.

Both oscillators are connected to a temperature compensating circuit, so that temperature influences are minimized.

The output signals of the left and the right oscillators are added up, and thereafter are fed into an infrared high level stage with transmitting diodes.

While the foregoing description and drawings represent the preferred embodiments of the present invention, it will be obvious to those skilled in the art that various changes and modifications may be made therein without departing from the true spirit and scope of the present invention.

What is claimed is:

1. An oscillator circuit for stabilizing the amplitude of a high frequency oscillation, comprising:
    a resonant circuit which is coupled with a first transistor having a base terminal, an emitter contact, and a collector contact;
    said first transistor developing an output voltage at the emitter contact which is fed back into a base circuit of the first transistor;
    said collector contact of the first transistor being coupled to a supply voltage source;
    said supply voltage source being coupled to the base terminal of the first transistor via a resistor;
    said emitter contact of said first transistor being coupled with the base terminal of a second transistor; and
    said second transistor having a collector contact being connected to the base terminal of the first transistor for controlling the voltage at the base terminal of the first transistor.

2. The oscillator circuit as claimed in claim 1, wherein said resistor comprises a series connection of a first resistor and a second resistor, and the collector contact of the second transistor is connected to the base terminal of the first transistor via the first resistor.

3. The oscillator circuit as claimed in claim 1, wherein a third resistor is arranged between the emitter contact and the base terminal of the first transistor, and the emitter contact of the first transistor is connected to ground via a fourth resistor, and the third and fourth resistors are selected to provide a minimum nonlinear distortion factor.

4. An infrared transmitting unit for providing an infrared transmitting channel having an audio input connection which is coupled with the oscillator circuit of claim 1.

5. A head phone infrared transmitting and receiving system comprising a transmitting unit as claimed in claim 4 and a head phone receiving system for receiving and processing the signals transmitted by the transmitting unit.

* * * * *